(12) United States Patent
Jung et al.

(10) Patent No.: US 8,124,979 B2
(45) Date of Patent: Feb. 28, 2012

(54) THIN FILM TRANSISTOR AND METHOD OF MANUFACTURING THE SAME

(75) Inventors: Ji-sim Jung, Yongin-si (KR); Myung-kwan Ryu, Yongin-si (KR); Jang-yeon Kwon, Yongin-si (KR); Kyung-bae Park, Yongin-si (KR); Min-koo Han, Seoul (KR); Sang-yoon Lee, Yongin-si (KR); Joong-hyun Park, Seoul (KR); Sang-myeon Han, Seoul (KR); Sun-jae Kim, Seoul (KR)

(73) Assignees: Samsung Electronics Co., Ltd. (KR); Seoul National University Industry Foundation (KR)

( * ) Notice: Subject to any disclaimer, the term of this patent is extended or adjusted under 35 U.S.C. 154(b) by 76 days.

(21) Appl. No.: 12/032,007

(22) Filed: Feb. 15, 2008

(65) Prior Publication Data

US 2008/0197413 A1  Aug. 21, 2008

(30) Foreign Application Priority Data

Feb. 15, 2007  (KR) .......................... 10-2007-0016033

(51) Int. Cl.
*H01L 27/14* (2006.01)

(52) U.S. Cl. .......... 257/72; 257/218; 257/219; 257/221; 257/61

(58) Field of Classification Search .................. 257/218, 257/219, 221, 61, 72
See application file for complete search history.

(56) References Cited

U.S. PATENT DOCUMENTS

| 2006/0194399 A1* | 8/2006 | Wen et al. ..................... 438/305 |
| 2006/0197088 A1* | 9/2006 | Isobe et al. ...................... 257/59 |
| 2007/0254402 A1* | 11/2007 | Dimmler et al. ................ 438/99 |
| 2008/0093464 A1* | 4/2008 | Dairiki et al. ................. 235/492 |

* cited by examiner

*Primary Examiner* — N Drew Richards
*Assistant Examiner* — Jae Lee
(74) *Attorney, Agent, or Firm* — Cantor Colburn LLP (57) ABSTRACT

Provided are a thin film transistor and a method of manufacturing the same. The thin film transistor includes: a lower structure; a semiconductor layer formed on the lower structure and including a plurality of doping regions; a first insulating layer and a second insulating layer formed on the semiconductor layer and separated from each other; a third insulating layer formed on the first insulating layer and the second insulating layer; and a gate electrode layer formed between regions of the third insulating layer respectively corresponding to the first insulating layer and the second insulating layer.

4 Claims, 10 Drawing Sheets

THIN FILM TRANSISTOR AND METHOD OF MANUFACTURING THE SAME

CROSS-REFERENCE TO RELATED PATENT APPLICATIONS

This application claims the benefit of Korean Patent Application No. 10-2007-0016033, filed on Feb. 15, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a top gate type thin film transistor and a method of manufacturing the same.

2. Description of the Related Art

Generally, a polysilicon (poly-Si) thin film transistor has excellent current driving capability and a fast operating speed as compared to an amorphous silicon thin film transistor. Due to these advantages, a poly-Si thin film transistor has been recently used as a switching device for a display device or a driving circuit. A conventional poly-Si thin film transistor is formed on a semiconductor substrate comprising a source region, a drain region, and a channel region, and a gate structure that contacts the source and drain regions is formed on the channel region. The gate structure comprises a gate insulating layer and a gate electrode layer that is electrically insulated by the gate insulating layer from a semiconductor layer.

In a conventional method of manufacturing a poly-Si thin film transistor, since the source and drain regions are formed through an ion implantation process using a gate electrode as a self-aligning mask, the source and drain regions are adjacent to the channel region. Thus, in an off state in which a voltage applied to the source or drain region is higher than a voltage applied to a gate electrode layer, a vertical electric field is generated in the source or drain region in a direction of the gate electrode. Since a carrier captured in a depletion region is excited by the electric field and thereby escapes from the depletion region, a leakage current may occur. Due to the leakage current, the on/off switching of a device is difficult, and the display quality of an active matrix liquid crystal display (AMLCD) or an active matrix organic light emitting diode (AMOLED) may be degraded.

In order to address the above-described problems, a new structure for dispersing a drain electric field has been suggested. A lightly doped drain (LDD) or offset structure having a predetermined resistance is formed between the gate structure and the source and drain regions to act as a kind of resistance for disturbing the flow of the leakage current. Thus, a reduction in the leakage current may be expected. However, in a method of manufacturing such a structure, an additional mask is required to form the LDD or offset structure and self-alignment does not occur. In addition, a doping process should be performed twice to form the source and drain regions and the LDD structure. Thus, it is difficult to guarantee the uniform characteristic of a thin film transistor. Also, since the method of manufacturing the structure is complicated, the manufacturing cost increase, yield is reduced, and a device characteristic may be lowered.

SUMMARY OF THE INVENTION

The present invention provides a thin film transistor in which a gate insulating layer having at least two step differences and a gate electrode layer having at least two step differences are formed so that the thin film transistor can be easily formed in a self-alignment structure.

According to an aspect of the present invention, there is provided a thin film transistor comprising: a lower structure; a semiconductor layer formed on the lower structure and including a plurality of doping regions; a first insulating layer and a second insulating layer formed on the semiconductor layer and separated from each other; a third insulating layer formed on the first insulating layer and the second insulating layer; and a gate electrode layer formed between regions of the third insulating layer respectively corresponding to the first insulating layer and the second insulating layer.

The semiconductor layer may include: a channel region formed below the third insulating layer between the first insulating layer and the second insulating layer; a first doping region formed below the first insulating layer and the second insulating layer; an offset region formed between the channel region and the first doping region; a second doping region formed below the third insulating layer formed at a left side of the first insulating layer and at a right side of the second insulating layer; an a third doping region formed at a side of the second doping region.

A dopant concentration of the second doping region may be higher than that of the first doping region.

A ratio of thicknesses of the first insulating layer and the second insulating layer and the third insulating layer may be 1:9 to 9:1.

A width of the third insulating layer may be larger than a distance between the first insulating layer and the second insulating layer and may be smaller than a distance between a left side of the first insulating layer and a right side of the second insulating layer.

The semiconductor layer may include: a channel region formed below the third insulating layer between the first insulating layer and the second insulating layer; a first doping region formed on a semiconductor layer below a region in which the first insulating layer and the third insulating layer are formed; an offset region formed between the first doping region and the channel region; a second doping region formed at a side of the first doping region below the first insulating layer and the second insulating layer; and a third doping region formed at a side of the second doping region.

According to another aspect of the present invention, there is provided a method of manufacturing a thin film transistor, the method comprising: (a) forming a semiconductor layer on a lower structure and patterning both sides of the semiconductor layer; (b) forming an insulating material on the lower structure and the semiconductor layer and patterning the insulating material to form a first insulating layer and a second insulating layer; (c) applying the insulating material onto the semiconductor layer, the first insulating layer, and the second insulating layer to form a third insulating layer; (d) applying a conductive material onto the third insulating layer and patterning the conductive material to form a gate electrode; and (e) injecting a dopant into the semiconductor layer and then performing annealing.

(c) may include: applying an insulating material onto the semiconductor layer, the first insulating layer, and the second insulating layer; applying a photosensitive material onto the insulating material and patterning the photosensitive material so that the photosensitive material has a width that is larger than a distance between the first insulating layer and the second insulating layer and is smaller than a distance between a left side of the first insulating layer and a right side of the second insulating layer to form a photosensitive layer; and removing the insulating material exposed to both sides of the photosensitive layer to form a third insulating layer.

The lower structure may include a substrate or an insulating material layer formed of $SiO_2$, $SiN_x$ or an organic material on the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. In the drawings, the thicknesses and widths of layers are exaggerated for clarity.

Figure 1A:
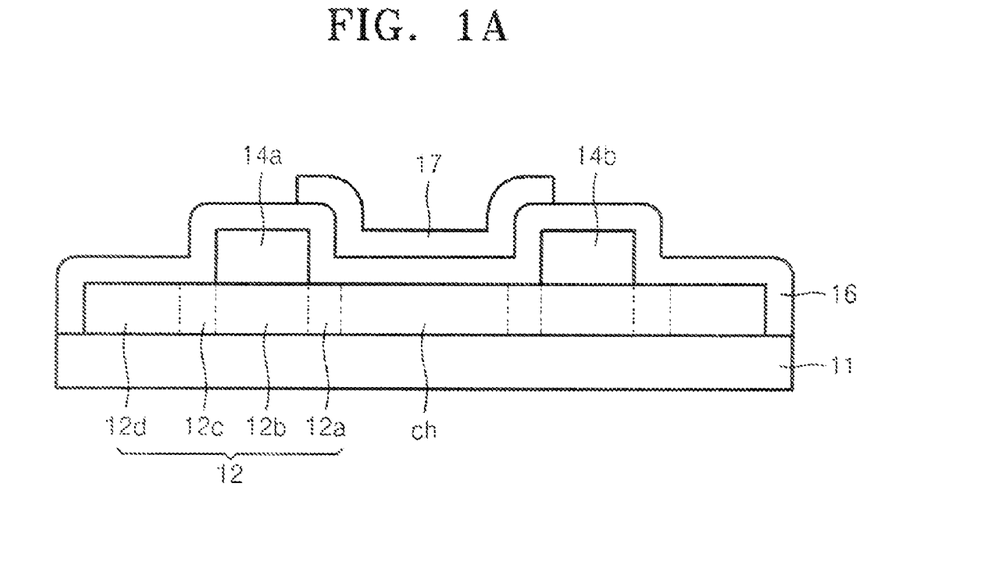
FIGS. 1A and 1B respectively illustrate the structure of a thin film transistor according to an embodiment of the present invention.

FIG. 1A illustrates the structure of a thin film transistor according to an embodiment of the present invention. Referring to FIG. 1A, a semiconductor layer 12 comprising a plurality of dopant regions is formed on a lower structure 11, and a first insulating layer 14a and a second insulating layer 14b are formed in a predetermined region of the semiconductor layer 12 to be separated from each other. A third insulating layer 16 is formed on the first insulating layer 14a, the second insulating layer 14b, and the semiconductor layer 12, and a gate electrode layer 17 is formed on the third insulating layer 16 formed between the first insulating layer 14a and the second insulating layer 14b.

The semiconductor layer 12 comprises a channel region ch formed below the third insulating layer 16 between the first insulating layer 14a and the second insulating layer 14b, a first doping region (lightly doped drain (LDD)) 12b formed below the first insulating layer 14a and the second insulating layer 14b, an offset region 12a formed between the channel region ch and the first doping region 12b, a second doping region 12c formed below the third insulating layer 16 formed on the left side of the first insulating layer 14a and having a higher doping concentration than that of the first doping region 12b, and a third doping region 12d formed on the left of the second doping region 12c.

Figure 1B:
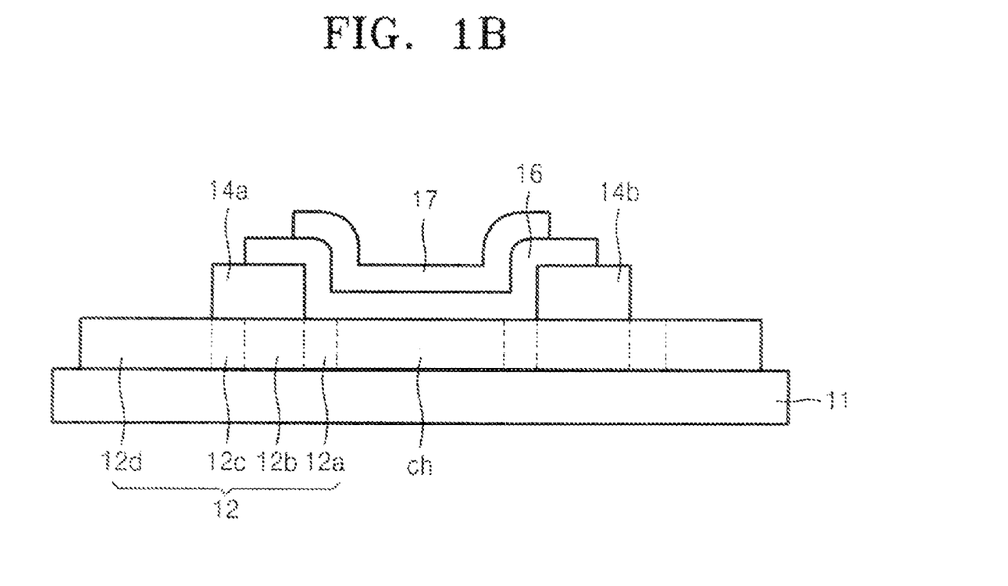

FIG. 1B illustrates the structure of a thin film transistor according to another embodiment of the present invention. Referring to FIG. 1B, a semiconductor layer 12 is formed on a lower structure 11, and a first insulating layer 14a and a second insulating layer 14b are formed in a predetermined region of the semiconductor layer 12. A third insulating layer 16 is formed on the first insulating layer 14a, the second insulating layer 14b, and the semiconductor layer 12, and a gate electrode layer 17 is formed on the third insulating layer 16 formed between the first insulating layer 14a and the second insulating layer 14b. Unlike the structure of FIG. 1A, the left end of the third insulating layer 16 of the thin film transistor of FIG. 1B is retreated from the left end of the first insulating layer 14a, and the right end of the third insulating layer 16 of the thin film transistor of FIG. 1B is retreated from the right end of the second insulating layer 14b.

The semiconductor layer 12 of FIG. 1B comprises doping regions whose doping concentrations are different from one another. Specifically, a channel region ch is formed in the semiconductor layer 12 formed below the gate electrode layer 17. A first doping region (lightly doped drain (LDD)) 12b doped with a dopant having a low concentration is formed in the semiconductor layer 12 in a region in which the first insulating layer 14a and the third insulating layer 16 are formed. An offset region 12a having a lower doping concentration that that of the first doping region 12b is formed between the first doping region 12b and the channel region ch. The offset region 12a is a region doped with a dopant that is injected through the third insulating layer 16 and the gate electrode layer 17 that are formed on the right side of the first insulating layer 14a. The offset region 12a has a low doping concentration and thus has low conductivity. A second doping region 12c having a higher doping concentration than that of the first doping region 12b is formed in the semiconductor layer 12 in a region in which the third insulating layer 16 is not formed and the first insulating layer 14a is formed. A third doping region 12d is formed on the left of the second doping region 12c.

Doping concentrations of respective doping regions formed in the semiconductor layer 12 of the thin film transistor illustrated in FIGS. 1A and 1B may be easily adjusted by the thicknesses of the first and second insulating layers 14a and 14b and by the thickness of the third insulating layer 16. The ratio of the thicknesses of the first insulating layer 14a and the second insulating layer 14b and the third insulating layer 16 may be adjusted from 1:9 to 9:1 in various ways.

A method of manufacturing the thin film transistor illustrated in FIG. 1A according to an embodiment of the present invention will now be described in detail with reference to FIGS. 2A through 2L.

Figure 2A:
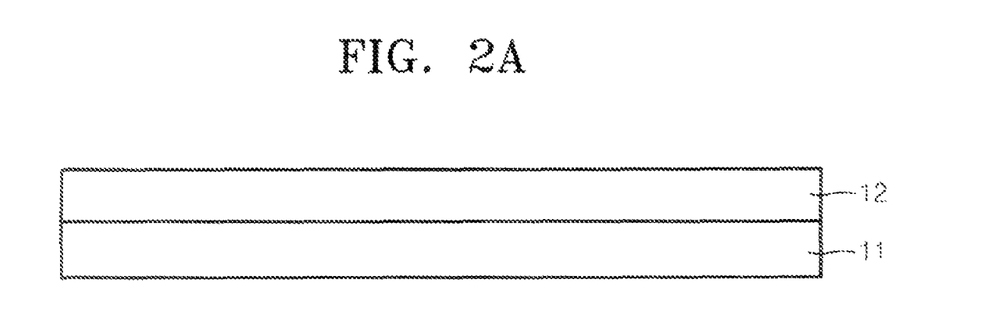
FIGS. 2A through 2L illustrate a method of manufacturing a thin film transistor according to an embodiment of the present invention.

Referring to FIG. 2A, a lower structure 11 is prepared. The lower structure 11 may have a substrate or an insulating material layer formed of $SiO_2$, $SiN_x$ or an organic material on the substrate. A semiconductor layer 12 to be used as an active region is formed on the lower structure 11. The semiconductor layer 12 may be formed of Si.

Figure 2B:
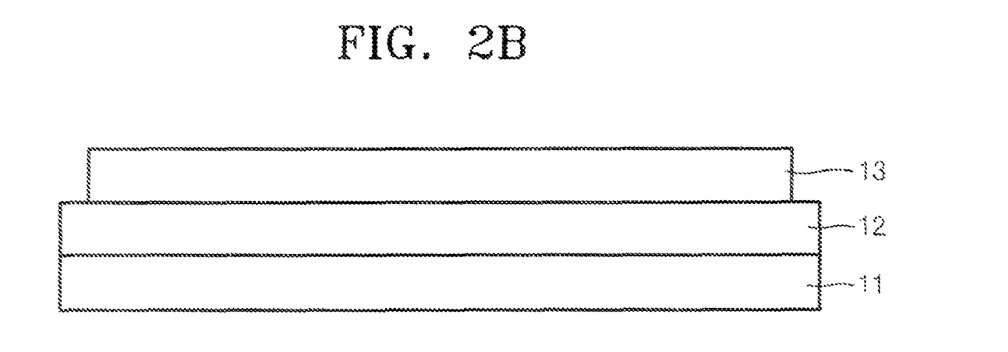
Figure 2C:
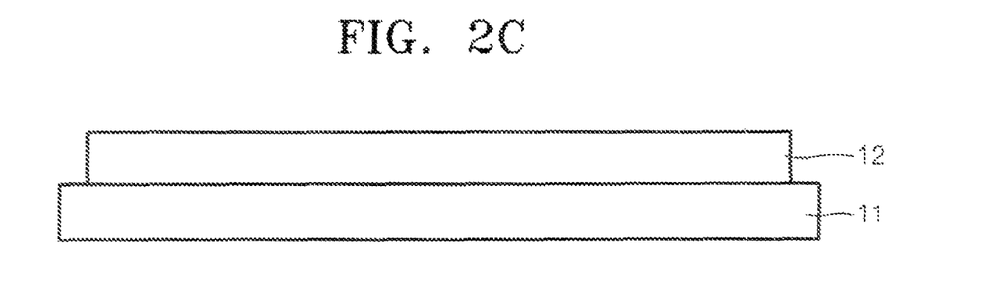

Referring to FIGS. 2B and 2C, a photosensitive layer 13 is formed on the semiconductor layer 12. Both sides of the photosensitive layer 13 are patterned. After both sides of the semiconductor layer 12 are patterned, the photosensitive layer 13 is removed.

Figure 2D:
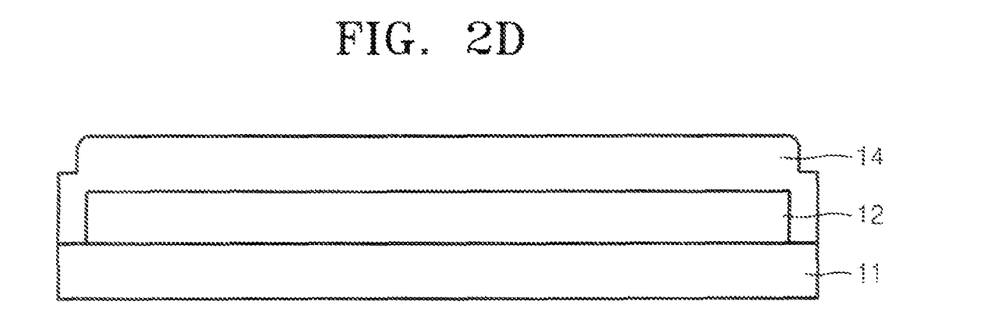
Figure 2E:
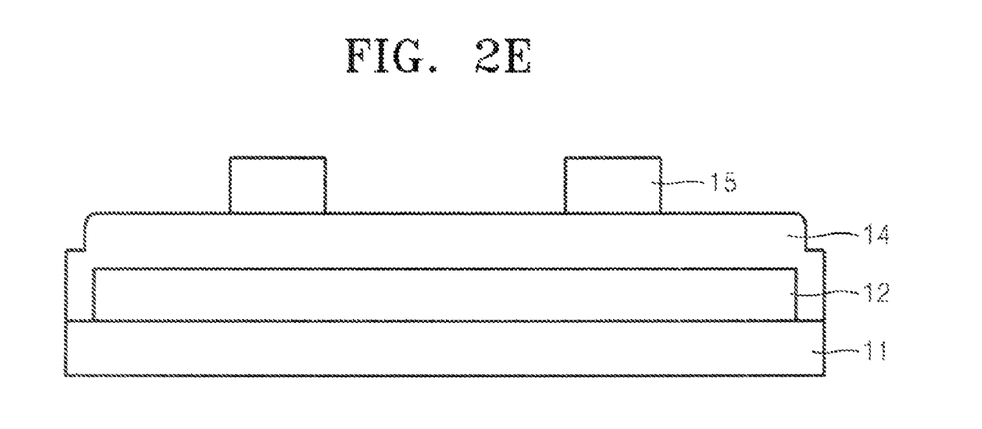

Referring to FIG. 2D, an insulating material 14 such as $SiO_2$ or $SiN_x$ is applied onto both sides of the lower structure 11 and the semiconductor layer 12. As illustrated in FIG. 2E, a photosensitive material is applied onto the insulting layer 14 and is patterned, thereby forming a photosensitive layer 15.

Figure 2F:
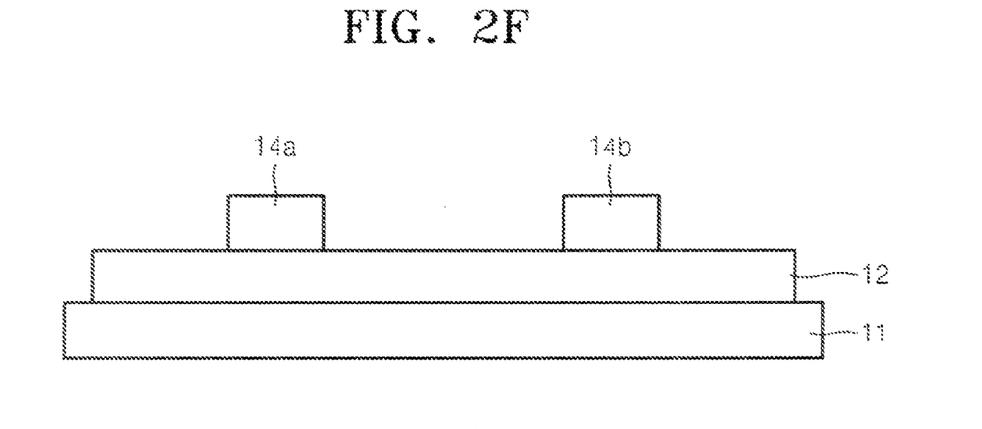

Referring to FIG. 2F, after the exposed insulating material 14 is patterned and removed, the photosensitive layer 15 is removed. As such, the first insulating layer 14a and the second insulating layer 14b remain on the semiconductor layer 12.

Figure 2G:
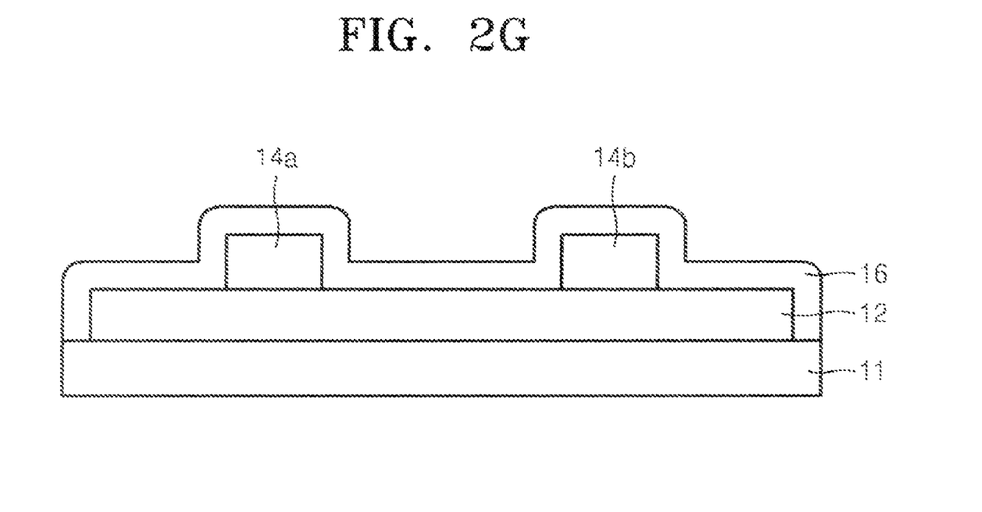
Figure 2H:
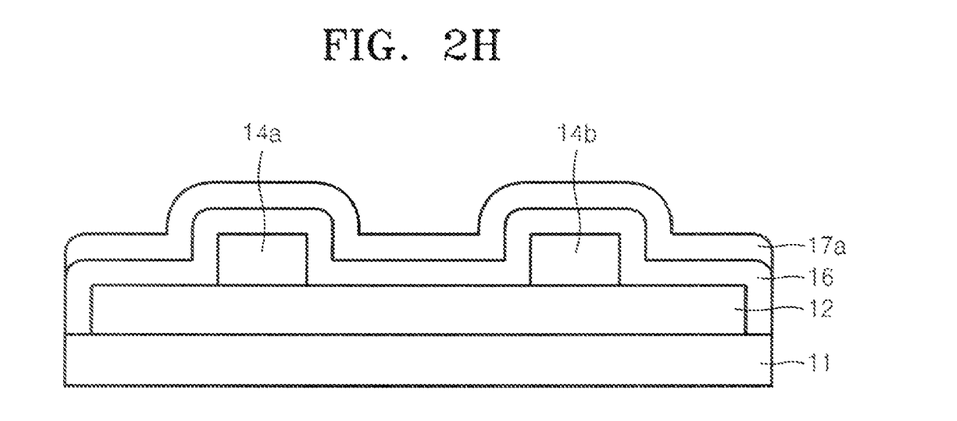

Referring to FIG. 2G, an insulating material is applied to both sides of the exposed lower structure 11, the semiconductor layer 12, the first insulating layer 14a, and the second insulating layer 14b, thereby forming the third insulating layer 16. The third insulating layer 16 may be formed of an insulating material such as $SiO_2$, $SiN_x$ or $Al_2O_3$. The ratio of the thicknesses of the first insulating layer 14 and the second insulating layer 14b and the third insulating layer 16 may be adjusted from 1:9 to 9:1. As illustrated in FIG. 2H, a conductive material layer 17a that is used in forming a gate electrode is deposited on the third insulating layer 16. The conductive material layer 17a may be formed of a metal or a metal oxide which is a gate electrode material of a general semiconductor transistor.

Figure 2I:
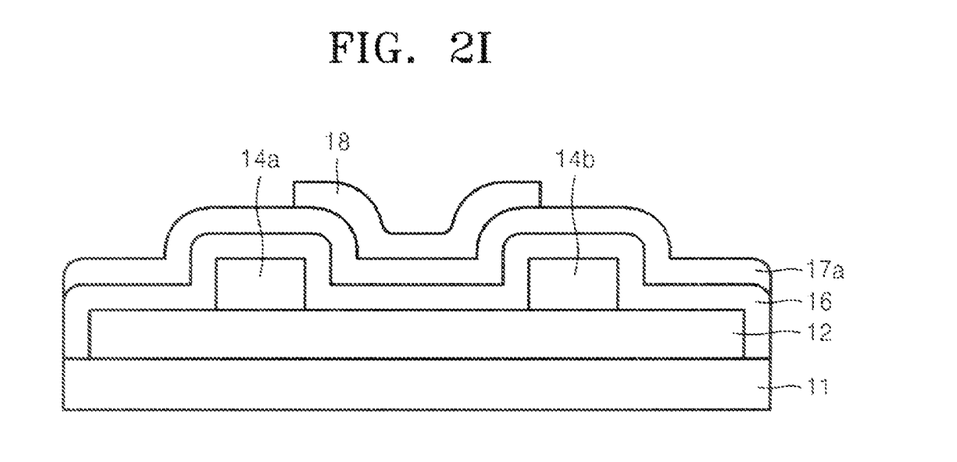
Figure 2J:
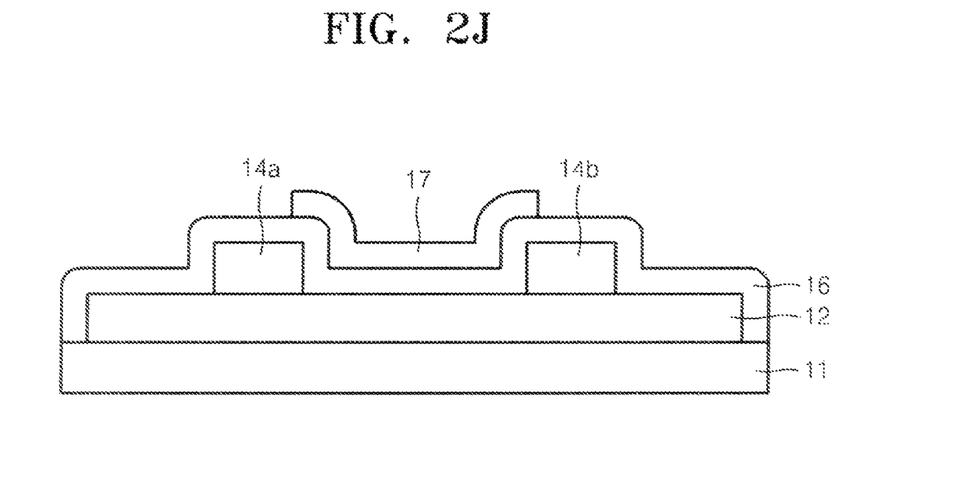

Referring to FIG. 2I, in order to form a gate electrode, a photosensitive material is applied between the conductive material layers 17a formed above the first insulating layer 14a and the second insulating layer 14b, and the photosensitive material is then patterned, thereby forming a photosensitive layer 18. As illustrated in FIG. 2J, the conductive material layer 17a is patterned using the photosensitive layer 18, thereby forming a gate electrode layer 17.

Figure 2K:
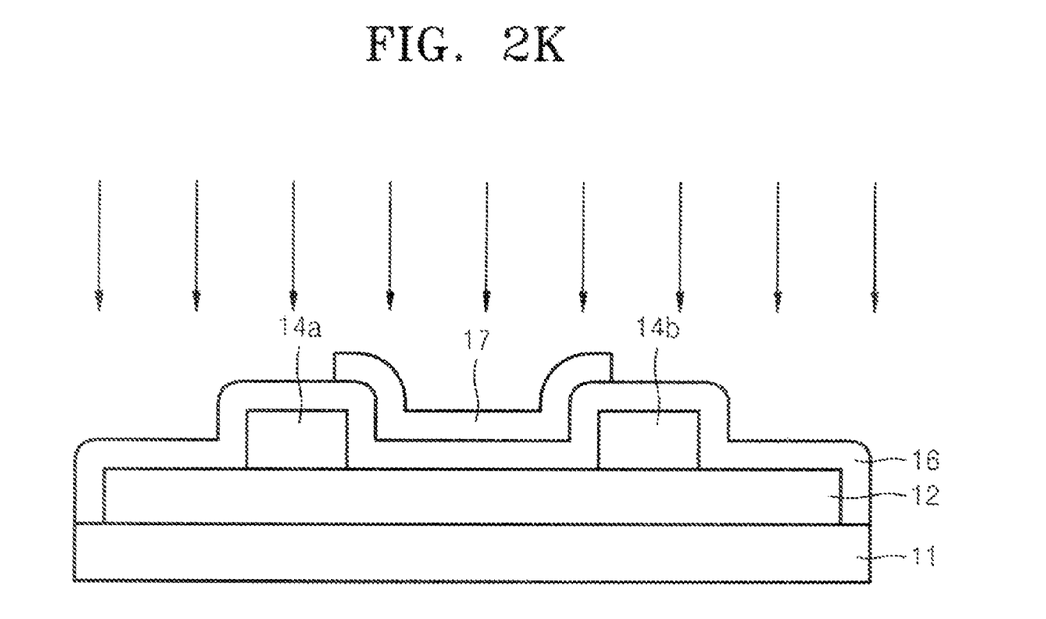
Figure 2L:
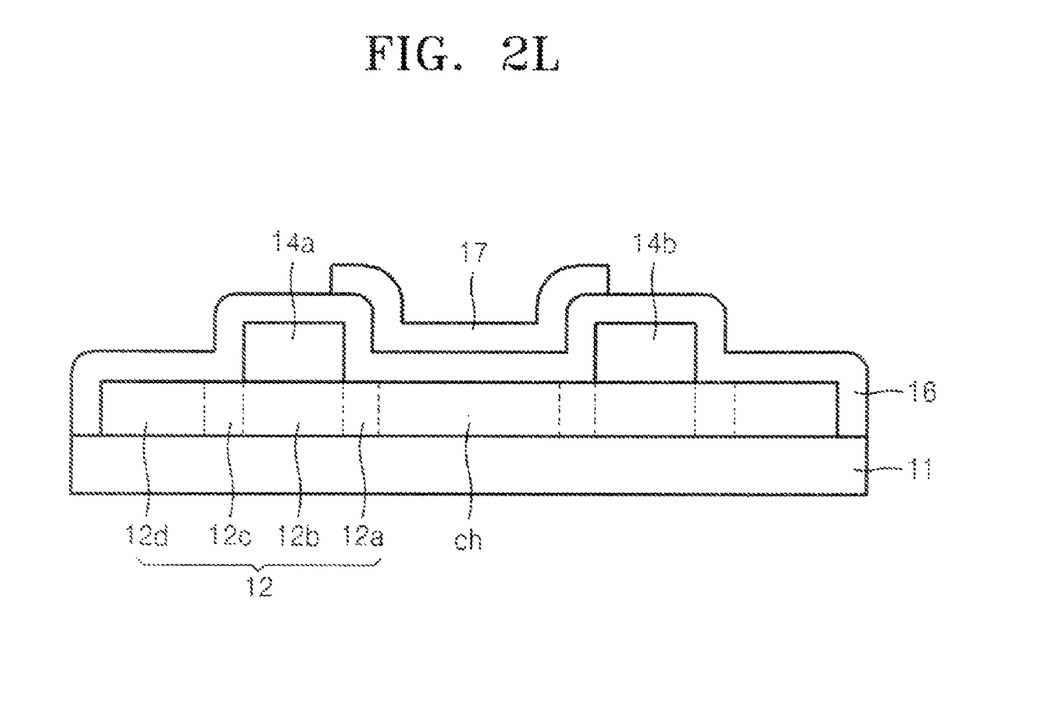

Referring to FIG. 2K, a dopant is implanted into the semiconductor layer 12 in an upward direction. For example, $N^+$ ions are doped so that a structure such as a channel can be formed in the semiconductor layer 12. After that, as illustrated in FIG. 2L, an activation process is performed using laser and annealing so that a thin film transistor according to the present embodiment of the present invention can be manufactured.

As the thicknesses of layers formed on the semiconductor layer 12 are different, the doping concentration of a dopant to be implanted into the semiconductor layer 12 is different according to the location of the semiconductor layer 12. A channel region ch is formed in the semiconductor layer 12 below the gate electrode layer 17. A first doping region (lightly doped drain (LDD)) 12b in which a dopant is doped with a low concentration is formed in the semiconductor layer 12 below the first insulating layer 14a and the second insulating layer 14b. An offset region 12a is formed between the first doping region 12b and the channel region ch. The offset region 12a has a low doping concentration of a dopant after undergoing a dopant implantation process through the third insulating layer 16 and the gate electrode layer 17 that are formed on the right side of the first insulating layer 14a. Thus, the offset region 12a has low conductivity. A second doping region 12c having a higher doping concentration than that of the first doping region 12b is formed in the semiconductor layer 12 below the third insulating layer 16 formed on the left side of the first insulating layer 14a. A third doping region 12d is formed on the left of the second doping region 12c. The above-described doping regions in the semiconductor layer 12 are symmetrical with respect to the channel region ch.

A method of manufacturing the thin film transistor illustrated in FIG. 1B according to another embodiment of the present invention will now be described in detail with reference to FIGS. 3A through 3M.

Figure 3A:
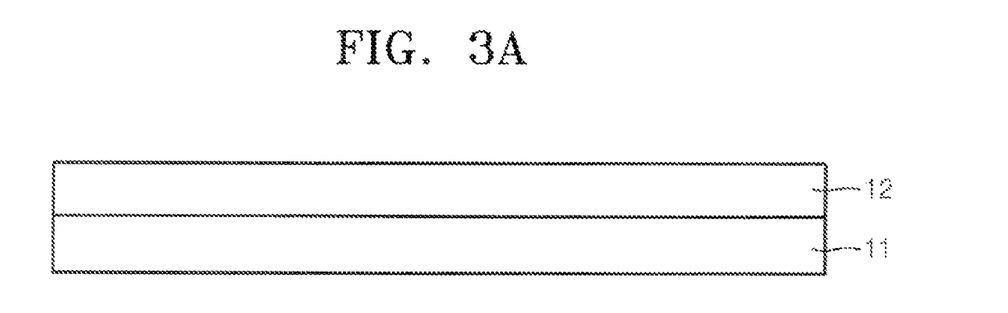
FIGS. 3A through 3M illustrate a method of manufacturing a thin film transistor according to another embodiment of the present invention.

Referring to FIG. 3A, a lower structure 11 is prepared. The lower structure 11 may include a substrate or an insulating material layer formed of $SiO_2$, $SiN_x$ or an organic material on the substrate. A semiconductor layer 12 to be used as an active region is formed on the lower structure 11. The semiconductor layer 12 may be formed of Si.

Figure 3B:
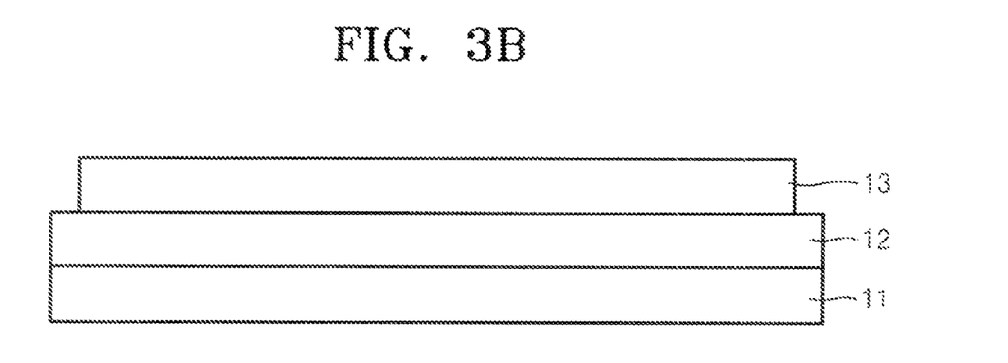
Figure 3C:
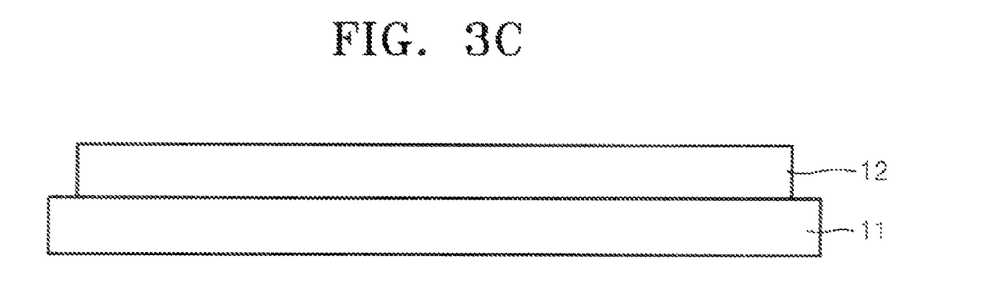

Referring to FIGS. 3B and 3C, a photosensitive layer 13 is formed on the semiconductor layer 12. Both sides of the photosensitive layer 13 are patterned, and thereafter, the photosensitive layer 13 is removed.

Figure 3D:
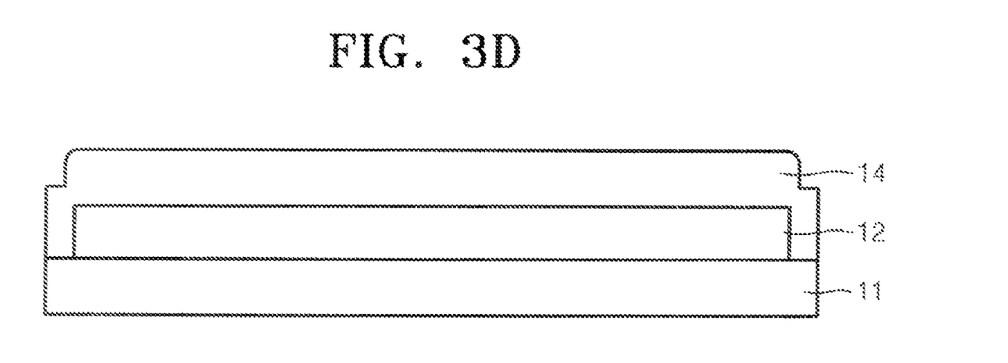
Figure 3E:
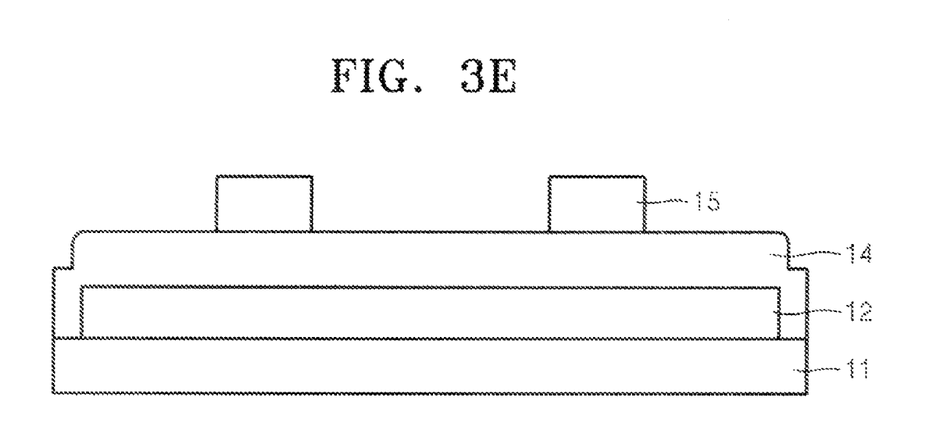

Referring to FIG. 3D, an insulating material 14 such as $SiO_2$ or $SiN_x$ is applied onto both sides of the lower structure 11 and the semiconductor layer 12. As illustrated in FIG. 3E, a photosensitive material is applied onto the insulting layer 14 and is patterned, thereby forming a photosensitive layer 15.

Figure 3F:
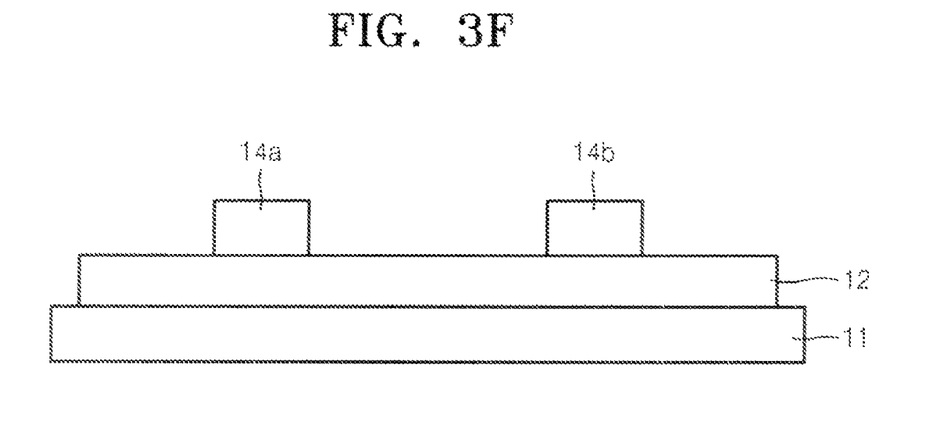

Referring to FIG. 3F, after the exposed insulating material 14 is patterned and removed, the photosensitive layer 15 is removed. As such, the first insulating layer 14a and the second insulating layer 14b remain on the semiconductor layer 12.

Figure 3G:
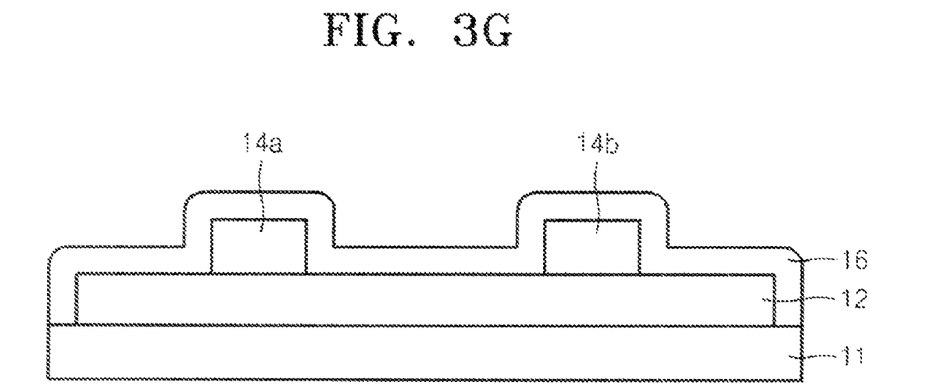

Referring to FIG. 3G, an insulating material is applied to both sides of the exposed lower structure 11, the semiconductor layer 12, the first insulating layer 14a, and the second insulating layer 14b, thereby forming the third insulating layer 16. The third insulating layer 16 may be formed of an insulating material such as $SiO_2$, $SiN_x$ or $Al_2O_3$. The ratio of the thicknesses of the first insulating layer 14a and the second insulating layer 14b and the third insulating layer 16 may be adjusted from 1:9 to 9:1. The above-described process is the same as that of FIGS. 2A through 2G.

Figure 3H:
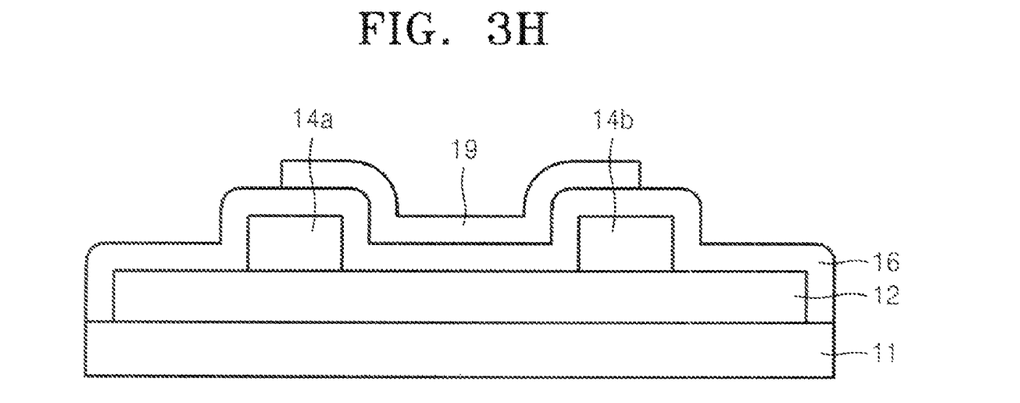
Figure 3I:
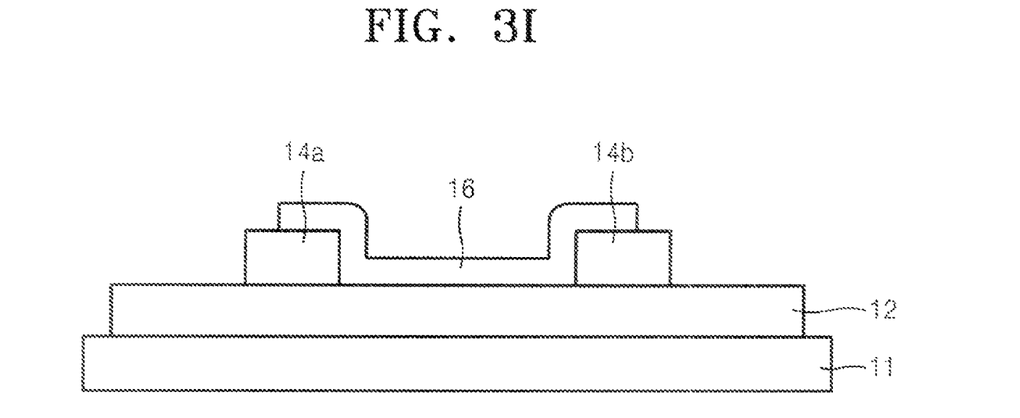

Referring to FIG. 3H, a photosensitive material is applied onto the third insulating layer 16 and both sides of the photosensitive material are patterned and removed, thereby forming a photosensitive layer 19. In this case, the width of the photosensitive layer 19 may be larger than a distance between the first insulating layer 14a and the second insulating layer 14b and may be smaller than a distance between a left side of the first insulating layer 14a and a right side of the second insulating layer 14b. Referring to FIG. 3I, both sides of the third insulating layer 16 are removed using the photosensitive layer 19. Thus, both ends of the third insulating layer 16 are retreated into the left end of the first insulating layer 14a and the right end of the second insulating layer 14b so that a step difference can be formed in both ends of the third insulating layer 16.

Figure 3J:
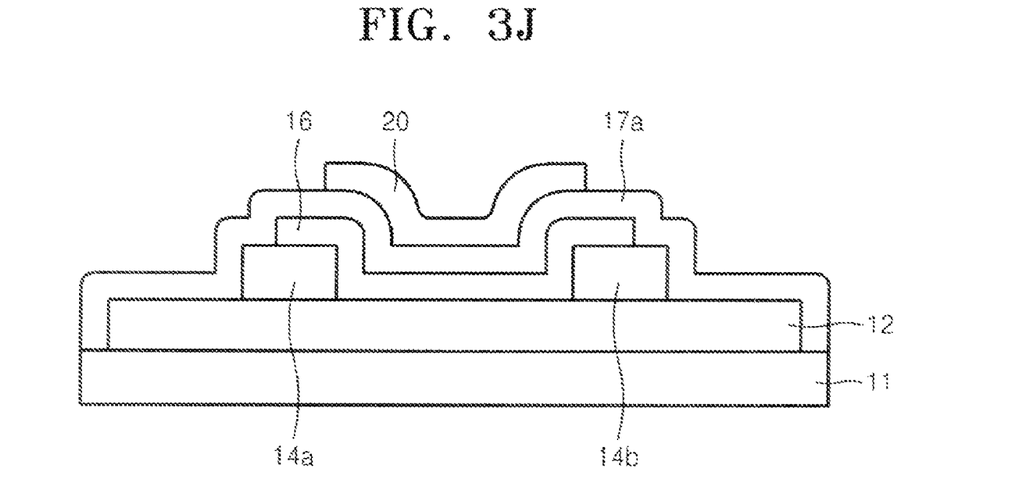

Referring to FIG. 3J, a conductive material layer 17a that is used when forming a gate electrode is deposited on the lower structure 11, the semiconductor layer 12, the first and second insulating layers 14a and 14b, and the third insulating layer 16. The conductive material layer 17a may be formed of a metal or a metal oxide which is a gate electrode material of a general semiconductor transistor. The photosensitive material is applied onto the conductive material layer 17a and is patterned, thereby forming a photosensitive layer 20. The width of the photosensitive layer 20 is smaller than the width of the third insulating layer 16.

Figure 3K:
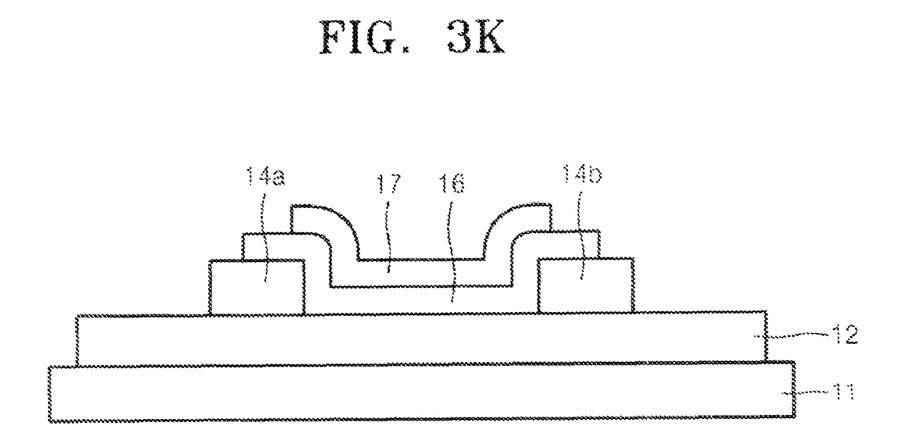

Referring to FIG. 3K, the conductive material layer 17a is patterned using the photosensitive layer 20, thereby forming a gate electrode layer 17.

Figure 3L:
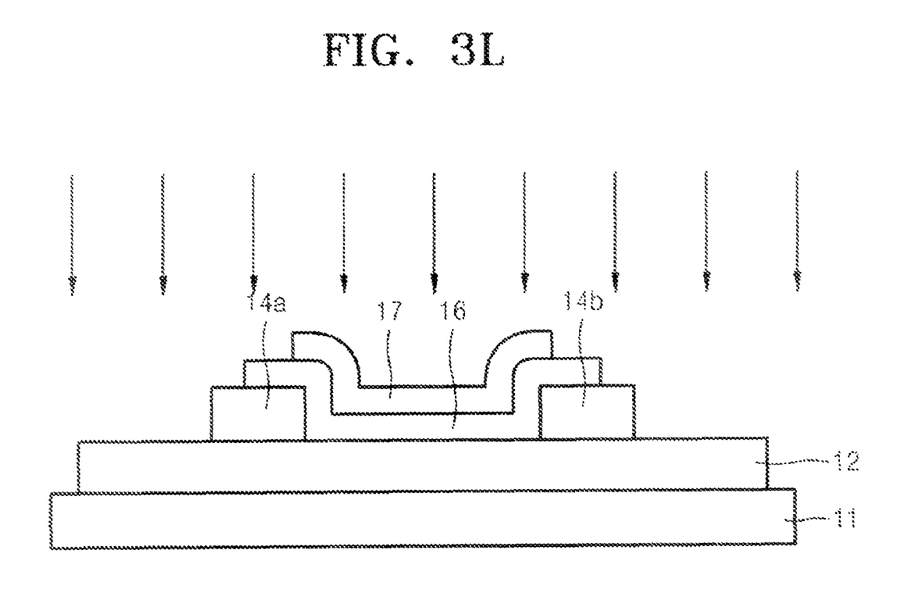
Figure 3M:
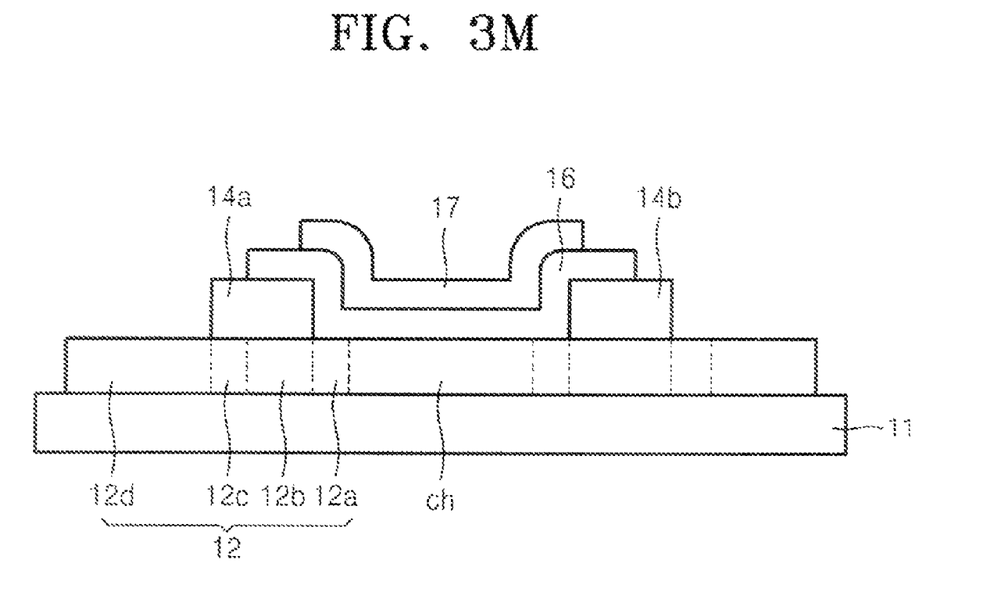

Referring to FIG. 3L, a dopant is implanted into the semiconductor layer 20 in an upward direction. For example, $N^+$ ions are doped so that a structure such as a channel can be formed in the semiconductor layer 12. After that, as illustrated in FIG. 3M, an activation process is performed using laser and annealing so that a thin film transistor according to the present embodiment of the present invention can be manufactured.

As the thicknesses and regions of layers formed on the semiconductor layer 12 are different, the doping concentration of a dopant to be implanted into the semiconductor layer 12 is different according to the location of the semiconductor layer 12. Specifically, a channel region ch is formed in the semiconductor layer 12 below the gate electrode layer 17, and a first doping region (lightly doped drain (LDD)) 12b in which a dopant is doped with a low concentration is formed in the semiconductor layer 12 of a region in which the first insulating layer 14a and the third insulating layer 16 are formed. An offset region 12a having a lower doping concentration than that of the first doping region 12b is formed between the first doping region 12b and the channel region ch. The offset region 12a is a region doped with a dopant that is injected through the third insulating layer 16 and the gate electrode layer 17 that are formed on the right side of the first insulating layer 14a. The offset region 12a has a low doping concentration and thus has low conductivity. A second doping region 12c having a higher doping concentration than that of the first doping region 12b is formed in the semiconductor layer 12 in a region in which the third insulating layer 16 is not formed and the first insulating layer 14a is formed. A third doping region 12d is formed on the left of the second doping region 12c. The above-described doping regions in the semiconductor layer 12 are symmetrical with respect to the channel region ch.

The method illustrated in FIGS. 3A through 3M comprises a process of patterning the third insulating layer 16, unlike the method illustrated in FIGS. 2A through 2L. Although the patterning process is further included, the width of the third insulating layer 16 is adjusted so that the second doping region 12c having a higher doping concentration than that of the first doping region 2b can be clearly defined. In addition, a dopant can be directly doped onto the semiconductor layer 12 so that the dopant concentration of the third doping region 12d can be easily adjusted.

According to the present invention, when a thin film transistor is formed, a doping concentration can be adjusted according to regions inside a semiconductor layer by adjusting the thickness of an insulating layer. When a dopant is implanted into the semiconductor layer, a doping degree according to regions of the semiconductor layer can be changed according to the thicknesses and locations of a first insulating layer, a second insulating layer, and a third insulating layer. An LDD region and a gate overlapping offset region formed in this way are conducive to reduce the leakage current of the thin film transistor. A dopant region having a higher dopant concentration than that of the LDD region is formed at a side of the LDD region such that concentration of an electric field that exists a boundary in a change of discontinuous doping concentration is minimized. Thus, device deterioration due to a hot-carrier stress caused by a strong horizontal electric field can be reduced such that the reliability of the thin film transistor is guaranteed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
   a lower structure;
   a semiconductor layer formed on the lower structure and including a plurality of doping regions;
   a first insulating layer and a second insulating layer directly formed on the semiconductor layer and separated from each other;
   a third insulating layer directly formed on the first insulating layer, on the second insulating layer, and on the semiconductor layer between the first insulating layer and the second insulating layer; and
   a gate electrode layer formed between regions of the third insulating layer respectively corresponding to the first insulating layer and the second insulating layer, and not contacting with the first insulating layer and the second insulating layer,
   wherein the semiconductor layer comprises:
   a channel region formed below the third insulating layer between the first insulating layer and the second insulating layer;
   a first doping region formed below the first insulating layer and the second insulating layer;
   an offset region formed between the channel region and the first doping region;
   a second doping region formed below the third insulating layer formed at a left side of the first insulating layer and at a right side of the second insulating layer; and
   a third doping region formed at a side of the second doping region.

2. The thin film transistor of claim 1, wherein a dopant concentration of the second doping region is higher than that of the first doping region.

3. A thin film transistor comprising:
   a lower structure;
   a semiconductor layer formed on the lower structure and including a plurality of doping regions;
   a first insulating layer and a second insulating layer directly formed on the semiconductor layer and separated from each other;
   a third insulating layer directly formed on the first insulating layer, on the second insulating layer, and on the semiconductor layer between the first insulating layer and the second insulating layer; and
   a gate electrode layer formed between regions of the third insulating layer respectively corresponding to the first insulating layer and the second insulating layer, and not contacting with the first insulating layer and the second insulating layer;
   wherein
   a width of the third insulating layer is larger than a distance between the first insulating layer and the second insulating layer and is smaller than a distance between a left side of the first insulating layer and a right side of the second insulating layer, and
   the semiconductor layer comprises:
   a channel region formed below the third insulating layer between the first insulating layer and the second insulating layer;
   a first doping region formed on a semiconductor layer below a region in which the first insulating layer and the third insulating layer are formed;
   an offset region formed between the first doping region and the channel region;
   a second doping region formed at a side of the first doping region below the first insulating layer and the second insulating layer; and
   a third doping region formed at a side of the second doping region.

4. The thin film transistor of claim 3, wherein a dopant concentration of the second doping region is higher than that of the first doping region.

* * * * *